United States Patent
Lin et al.

(10) Patent No.: US 9,698,182 B2
(45) Date of Patent: Jul. 4, 2017

(54) DIGITAL IMAGING AND PULSE DETECTION ARRAY

(71) Applicant: Hamilton Sundstrand Corporation, Charlotte, NC (US)

(72) Inventors: Minlong Lin, Plainsboro, NJ (US); Joshua Lund, Dallas, TX (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 185 days.

(21) Appl. No.: 14/672,295

(22) Filed: Mar. 30, 2015

(65) Prior Publication Data

US 2016/0293647 A1    Oct. 6, 2016

(51) Int. Cl.
*H01L 27/146*  (2006.01)
*G01S 17/02*  (2006.01)
*G01S 7/48*  (2006.01)
*G01S 7/486*  (2006.01)

(52) U.S. Cl.
CPC ...... *H01L 27/14609* (2013.01); *G01S 7/4804* (2013.01); *G01S 7/4863* (2013.01); *G01S 17/023* (2013.01); *H01L 27/14643* (2013.01)

(58) Field of Classification Search
CPC .... G01S 17/023; G01S 7/4804; G01S 7/4863; H01L 27/14609; H01L 27/14643
See application file for complete search history.

(56) References Cited

U.S. PATENT DOCUMENTS

| 4,529,886 | A | 7/1985 | Yokoyama et al. |
|---|---|---|---|
| 5,659,360 | A | 8/1997 | Mori et al. |
| 6,448,572 | B1 | 9/2002 | Tennant et al. |
| 8,426,828 | B2 | 4/2013 | Dierickx |
| 8,716,643 | B2 | 5/2014 | Eldesouki et al. |
| 2005/0068517 | A1 | 3/2005 | Evans et al. |
| 2010/0213353 | A1* | 8/2010 | Dierickx ............... G01T 1/247 250/214 R |
| 2012/0305786 | A1* | 12/2012 | Dierickx ............... G01J 1/44 250/371 |
| 2014/0346154 | A1 | 11/2014 | Blei et al. |

FOREIGN PATENT DOCUMENTS

| EP | 0658047 | 6/1995 |
|---|---|---|
| WO | 2013108204 | 7/2013 |

OTHER PUBLICATIONS

U.S. Appl. No. 14/672,336, filed Mar. 30, 2015.
Belgian Search Report and Written Opinion for Application No. 2016/5222 mailed Oct. 25, 2016.

* cited by examiner

*Primary Examiner* — Francis M Legasse, Jr.
(74) *Attorney, Agent, or Firm* — Carlson, Gaskey & Olds, P.C.

(57) ABSTRACT

An imaging and pulse detection array includes: a plurality of pixels connected to a controller, the controller being configured to generate an image based on an image signal originating from each pixel in the plurality of pixels and configured to detect a pulse on at least one of the pixels in the plurality of pixels, and each of the pixels in the plurality of pixels including an imaging circuit and a pulse detection circuit, the imaging circuit and the pulse detection circuit including a shared circuit architecture, and wherein the imaging circuit and the pulse detection circuit include a shared portion.

4 Claims, 3 Drawing Sheets

US 9,698,182 B2

DIGITAL IMAGING AND PULSE DETECTION ARRAY

TECHNICAL FIELD

The present disclosure relates generally to image sensing and pulse detection circuitry, and more particularly to an implementation of an imaging pixel including imaging sensing and pulse detection on a single chip.

BACKGROUND

Infrared detector systems, LIDAR (laser illuminated detection and ranging) systems, and imaging systems in industrial processes utilize imaging pixel arrays and pulse detection pixel arrays to detect the presence of a laser pulse within an image. The properties of the laser pulse can then be analyzed by a controller to determine pertinent information such as a distance of the laser pulse, the time period of the laser pulse, or any other information needed by the controller.

Existing imaging and pulse detecting systems utilize distinct imaging circuits and pulse detection circuits, with each of the circuits have different architectures. Due to the distinct architectures, the imaging portion and the pulse detection portion do not interoperate and require the utilization of two distinct circuits within each pixel, one for each function. The dual chip configuration of existing pixels results in lager pixel sizes and increases the weight of the pixel array.

SUMMARY OF THE INVENTION

Disclosed is an imaging and pulse detection array including: a plurality of pixels connected to a controller, the controller being configured to generate an image based on an image signal originating from each pixel in the plurality of pixels and configured to detect a pulse on at least one of the pixels in the plurality of pixels, and each of the pixels in the plurality of pixels including an imaging circuit and a pulse detection circuit, the imaging circuit and the pulse detection circuit including a shared circuit architecture, and wherein the imaging circuit and the pulse detection circuit include a shared portion.

Also disclosed is a method for operating a pixel for an imaging and pulse detection array including: detecting a light input at a shared optical detection input and passing the light input through at least one additional shared circuit element, providing an output from the at least one shared circuit element to an imaging circuit and to a pulse detection circuit, wherein the imaging circuit and the pulse detection circuit share a circuit architecture, and outputting an imaging signal from the imaging circuit to a controller, and outputting a pulse detection signal from the pulse detection circuit to a pulse processing circuit.

These and other features of the present invention can be best understood from the following specification and drawings, the following of which is a brief description.

DETAILED DESCRIPTION OF AN EMBODIMENT

Imaging systems, including imaging systems with laser pulse detection features, utilize an array of pixels to capture and analyze an image. Typically within each array, every pixel is approximately identical. In some exemplary pixel arrays, each pixel includes a pulse detection system and an imaging system.

Figure 1:
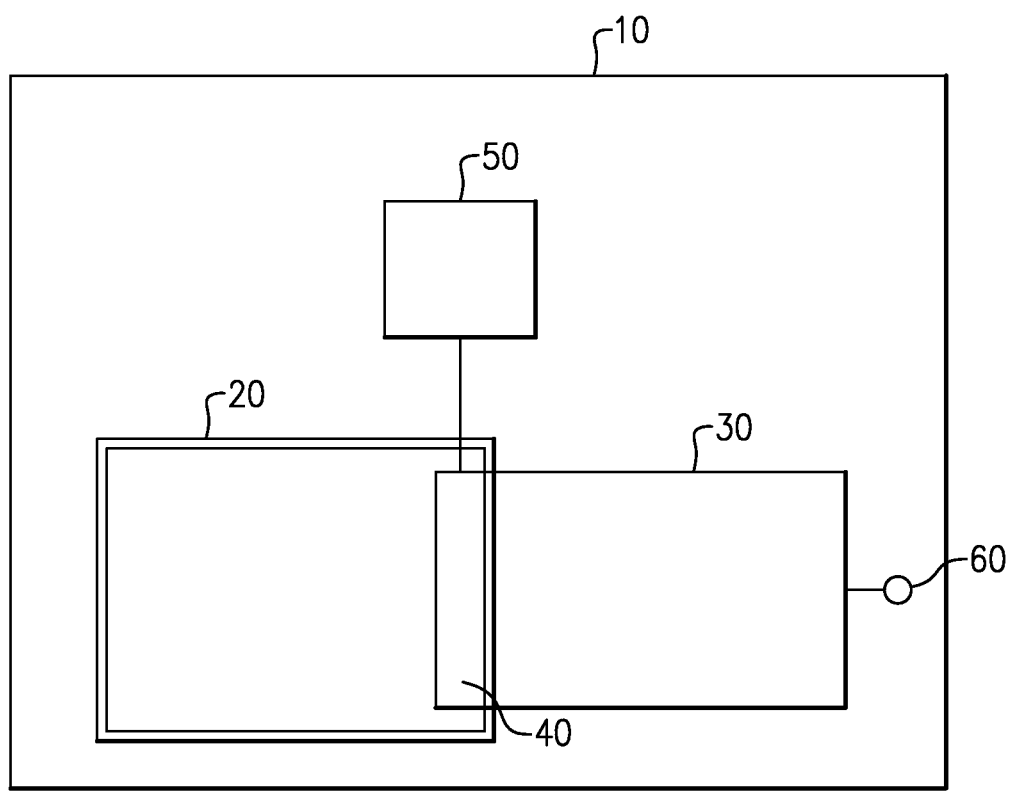
FIG. 1 schematically illustrates an imaging and pulse detection pixel according to one example.

FIG. 1 schematically illustrates a pixel 10 for utilization in an imaging system with laser pulse detection. The pixel 10 includes a pulse detection circuit 20 and an imaging circuit 30. Also included within the pixel 10 is a pulse processing circuit 50 connected to one or both of the imaging circuit 30 and the pulse detection circuit 20. In the example pixel 10 of FIG. 1, the pulse detection circuit 20 and the imaging circuit 30 utilize the same circuit architecture and are mounted on a single integrated circuit chip. In some examples, the single integrated circuit chip can be a readout integrated circuit (ROIC) chip. In alternative examples, the single integrated circuit chip can be a different type of integrated circuit chip, as required by a given system.

The pulse processing circuit 50 is a digital logic circuit and is connected in a manner that allows the digital logic circuit to receive a pulse detection signal from the pulse detection circuit 20. When the pulse processing circuit 50 receives a pulse detection, the pulse processing circuit 50 applies digital logic and processing to the pulse detection signal to generate a pulse detection output for a controller. In some examples the output can include a timestamp and coordinate address encoded signal identifying the pixel where the pulse is detected. In other examples, the output can be any other processed pulse detected signal. The pulse detected signal is provided to an external controller that analyzes data from all the pixels in the pixel array.

An image output 60 extends from the imaging circuit 30, and connects the image circuit 30 to the controller. The controller utilizes the image signal from the pixel 10, in conjunction with the image signal from each other pixel in the pixel array, to construct an image. The construction of the image by the controller can be done in any known manner and utilizing any known imaging technique.

As both the imaging circuit 30 and the pulse detection circuit 20 utilize the same architecture, it is possible to utilize a single instance of redundant portions of the image circuit 30 and the pulse detection circuit 20. As a result, portions of the circuit are shared between the imaging circuit 30 and the pulse detection circuit 20. The shared portions 40 are illustrated as an overlapping circuit portion in the example of FIG. 1.

In a practical implementation, the imaging circuit 30 and the pulse detection circuit 20 include multiple additional inputs and outputs, as is conventionally known in the imaging arts. The additional inputs and outputs provide reference voltages and currents, ground connections and the like.

Figure 2:
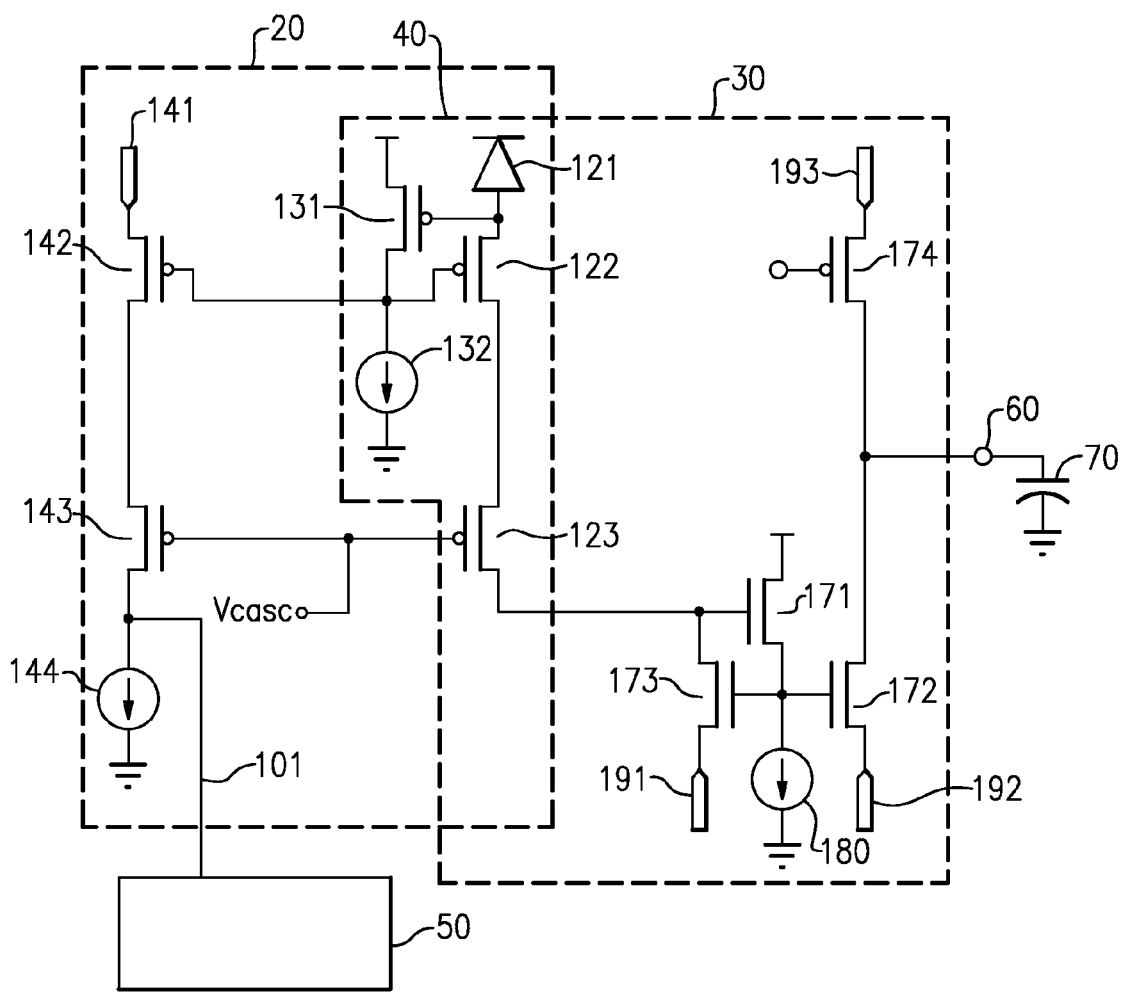
FIG. 2 schematically illustrates an exemplary topology for the imaging and pulse detection pixel of FIG. 1.

With continued reference to FIG. 1, and with like numerals indicating like elements, FIG. 2 schematically illustrates an exemplary topology for the imaging and pulse detection pixel 10 of FIG. 1. The circuit topology includes the pulse detection circuit 20 and the imaging circuit 30, with an overlapping shared portion 40 as described above.

Included in the overlapping shared portion 40 is an optical detection device 121, such as a light sensing diode. In alternative examples, alternative optical sensing devices can be utilized to the same effect. The optical detection device 121 in the illustrated example is reverse biased. In such an example, the optical detection device 121 conducts a current when light strikes the optical detection device, providing the light detection portion of both the imaging circuit 30 and the pulse detection circuit 20. Connected to the anode of the optical detection device 121 is an amplifier 122. In the illustrated example, the amplifier is in the form of a voltage controlled switch. In one example, the voltage controlled switch is an FET transistor. In alternative examples, other type of voltage controlled switches or other types of amplifiers may be utilized. Further included within the shared portion 40 is a switching element 131 and a current source 132. The switching element 131 and the current source 132 regulate the reverse-bias of the optical detection device 121.

A cascode FET 123 including a switching device, such as a P-channel FET operated in the saturation region, connects the amplifier 142 to an output 101. The output 101 is, in turn, connected to the pulse processing circuit 50. In alternative examples, alternative current sources including a switching device can be utilized in place of the illustrated P-channel FET operated in the saturation region. In some embodiments, the cascode FET 143 requires a match with a cascode FET 123 in the pulse detection circuit 20. The cascode FET 143 can substantially increase the impedance at node 101 to the pulse processing circuit 50 and establish desired amplification properties for the pulse detection circuit 20.

The pulse detection circuit 20 uses a configuration of switching elements 131, 142, 143, current sources 132, 144, and reference voltages 141 in conjunction with the shared circuit components (the amplifier 122 and the cascode FET 123) to form a complete pulse detection circuit 20 that provides a pulse detection output to an output 101. Similar pulse detection circuits are understood within the art, and the specific pulse detection topology illustrated in FIG. 2 can be altered depending on the specific needs of a given pulse detection system.

The cascode FET 123 in the shared portion 40 is included in an imaging circuit 30 including voltage controlled switches 171, 172, 173, 174, a current source 180, and reference inputs 191, 192, 193. The output of the cascode FET 123 controls the state of a first voltage controlled switch 171. The voltage controlled switches 171 and 172 form a current mirror with current gain controlled by the difference between the reference voltages 191, 192. Voltage controlled switch 171 and current source 180 form a lag-mitigation circuit which provides beneficial effects of accelerating the signal response when imaging with a dark background.

The inclusion of the reference voltage 192 inserts a gain into the system. An output 60 provides imaging data to a controller (not pictured). The controller interprets the imaging data from the illustrated pixel, and each other pixel in the pixel array, to generate an overall image. A reference voltage 193 provides a reset signal to reset the imaging circuit 30 when imaging data has been received at the controller 190. The reference voltage 193 is connected to the remainder of the imaging circuit 30 via a voltage controlled switch 174 when the voltage controlled switch 174 is on. The on/off state of the voltage controlled switch 174 is controlled by the external controller.

In some examples, the output 60 is connected to an optional integration capacitor 70, which in turn connects to the controller. In such an example, the integration capacitor provides filtering to the imaging output.

In the above example, the switches and current sources of the imaging circuit 30 and the pulse detection circuit 20 utilize the same architecture, and are able to be integrated into a single overall circuit, as is illustrated in FIG. 2. While a specific topology of the imaging circuit 30 and the pulse detection circuit 20 are illustrated in the example of FIG. 2, one of skill in the art, having the benefit of this disclosure, will understand that alternate topologies of either or both, with the alternate topologies sharing an architecture, could similarly be utilized. One of skill in the art, having the benefit of this disclosure will further understand that the specific gains, resistances, voltages, and the like, of each circuit component in the imaging circuit 30 and the pulse detection circuit 20 can be adjusted or modified to achieve recognized alterations to the gains and impedances of the corresponding circuits.

Figure 3:
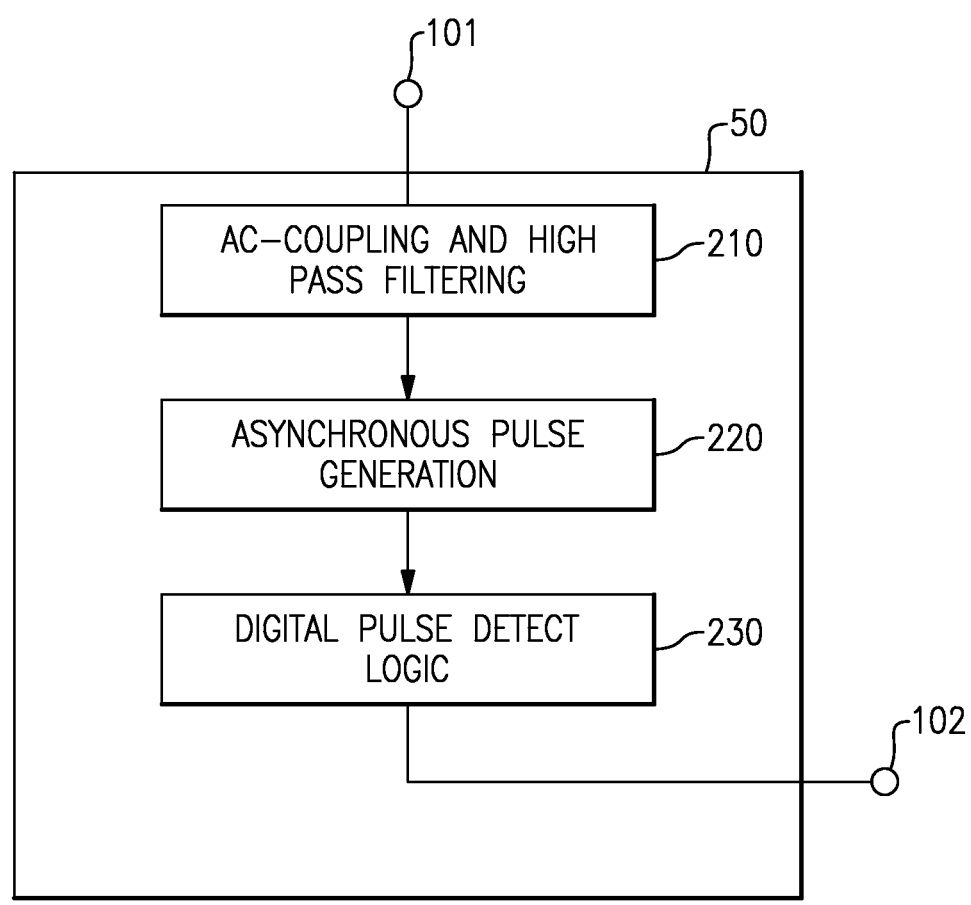
FIG. 3 schematically illustrates a pulse processing element of the pixel of FIGS. 1 and 2.

As described above, with regards to FIG. 1, the pulse detection circuit 20 provides an output to a digital logic based pulse processing circuit 50. The digital pulse processing circuit 50 includes multiple digital processing elements, such as digital logic circuits, that prepare a detected pulse for utilization by the controller. FIG. 3, schematically illustrates the digital pulse processing features described in the pixel of FIGS. 1 and 2. The digital processing circuit 50 includes at least three components, an AC-coupling and high pass filtering process 210, an asynchronous pulse generation process 220 and a digital pulse detect logic process 230. Alternative digital pulse processing circuits can includes additional processes.

Initially, the digital pulse detection signal is received at the digital pulse processing circuit 50 from the output 101 of the pulse detection circuit 20. The signal is passed to the AC-coupling and high pass filtering process 210, which pre-processes the signal to place the signal in a condition for digital analysis from the remaining two processes 220, 230. The AC-coupling and high pass filtering process 210 removes low frequencies from the signal, and does not perform any analysis of the signal for pulses.

Once the pre-processing has been completed, the pulse detection signal is passed to the asynchronous pulse generation logic process 220. The asynchronous pulse generation logic uses a digital logic process to analyze the output of the pulse detection circuit asynchronously with (independently of) the imaging process utilized by the attached controller. By way of example, the asynchronous pulse generation process 220 can include identifying if a pulse occurred, if the pixel is in a subset of pixels where a pulse was expected to occur, or any similar means of limiting or reducing the number of pixels to be analyzed by a controller for a pulse signal.

The output of the asynchronous pulse generation logic is provided to the digital pulse detection logic process 230. The digital pulse detection logic applies the generated pulse from the asynchronous pulse generation process 220 to a digital logic circuit. The digital logic circuit determines if a pulse is detected at the light sensing element 121. When a pulse is detected, the digital pulse detect logic 230 outputs a pulse signal to a controller through an output 102.

As a result of the digital processing included within the pulse processing circuit 50, the imaging and pulse detection chip only outputs pulse data to the controller when a pulse is detected by the light sensing element 50. In this way, the processing requirement of the controller is reduced.

Further, while described and illustrated above as only a single embodiment of a single type of imaging and pulse detection circuit, one of skill in the art and having the benefit of this disclosure will recognize that any other type of imaging and pulse detection circuit could be utilized in conjunction with the above teaching to form a similar single chip pulse detection and imaging circuit for utilization within a single pixel.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An imaging and pulse detection array comprising:
a plurality of pixels connected to a controller, the controller being configured to generate an image based on an image signal originating from each pixel in said plurality of pixels and configured to detect a pulse on at least one of said pixels in said plurality of pixels;
each of said pixels in said plurality of pixels including an imaging circuit and a pulse detection circuit, the imaging circuit and the pulse detection circuit including a shared circuit architecture, and wherein said imaging circuit and said pulse detection circuit include a shared portion
the shared portion comprises an optical detection device configured to provide an optical detection input to each of said imaging circuit and said pulse detection circuit and a pulse detection output;
said pulse detection output being connected to a pulse processing circuit within each pixel of said plurality of pixels; and
said pulse processing circuit is a bandwidth-processing circuit including an AC-coupling and high pass filtering process, an asynchronous pulse generation process and a digital pulse detection process.

2. The imaging and pulse detection array of claim 1, wherein said AC-coupling and high pass filtering process is a bandwidth processing process configured to remove frequencies below a pass threshold from the pulse detection output.

3. The imaging and pulse detection array of claim 1, wherein said digital pulse detection process is a bandwidth processing process configured to identify a presence of a pulse on the pulse detection output.

4. The imaging and pulse detection array of claim 1, wherein the asynchronous pulse generation process is a bandwidth processing process configured to reduce a number of pulse detection outputs passed to the controller by the pulse processing circuit.

* * * * *